US008759662B1

(12) United States Patent
Nolas

(10) Patent No.: US 8,759,662 B1
(45) Date of Patent: Jun. 24, 2014

(54) BULK DIMENSIONAL NANOCOMPOSITES FOR THERMOELECTRIC APPLICATIONS

(75) Inventor: George S. Nolas, Tampa, FL (US)

(73) Assignee: University of South Florida, Tampa, FL (US)

( * ) Notice: Subject to any disclaimer, the term of this patent is extended or adjusted under 35 U.S.C. 154(b) by 770 days.

(21) Appl. No.: 12/417,326

(22) Filed: Apr. 2, 2009

(51) Int. Cl.
*H01L 35/16* (2006.01)

(52) U.S. Cl.
USPC ............................ 136/238; 136/201; 136/241

(58) Field of Classification Search
USPC .............. 136/200, 203, 205, 236.1, 239, 238, 136/237; 438/54
See application file for complete search history.

(56) References Cited

U.S. PATENT DOCUMENTS

| 7,952,015 | B2* | 5/2011 | Sterzel et al. ................. | 136/238 |
| 2006/0102224 | A1 | 5/2006 | Chen et al. | |
| 2006/0243314 | A1* | 11/2006 | Ota et al. ...................... | 136/200 |
| 2007/0160747 | A1* | 7/2007 | Mitzi et al. ...................... | 427/74 |
| 2008/0173342 | A1* | 7/2008 | Bell et al. ...................... | 136/201 |
| 2009/0321692 | A1* | 12/2009 | LoCascio et al. .......... | 252/518.1 |

OTHER PUBLICATIONS

Muhammed et al., Nanostructured Skutterudites, Thermoelectrics Handbook, Macro to Nano, chapter 41, pp. 41-1 to 41-10, 2006.*
Kishimoto et al., Preparation of Sintered Degenerate n-type PbTe with a Small Grain Size and Its Thermoelectric Properties, Applied Physics, vol. 92, pp. 2544-2549, 2002.*
Nesheva et al., Nanoparticle Layers of CdSe buried in Oxide and Chalcogenide Thin Film Matrices, Vacuum, vol. 65, pp. 109-113, 2002.*
Chen et al. 2003. "Recent Developments in Thermoelectric Materials." International Materials Review. vol. 48. No. 1. pp. 45-66.
Blatter et al. 1986. "Electrical Breakdown at Semiconductor Grain Boundaries." Physical Review B. vol. 34. No. 12. pp. 8555-8572.
Marom et al. 2006. "The Contribution of Grain Boundary Scattering Versus Surface Scattering to the Resistivity of Thin Polycrystalline Films." The Solid Films. vol. 510. pp. 62-67.
Seager. 1981. "Grain Boundary Recombination: Theory and Experiment in Silicon." Journal of Applied Physics. vol. 52. No. 6. pp. 3960-3968.
Koga et al. 2000. "Experimental Proof-of-Principle Investigation of Enhanced Z3DT in (001) Oriented Si/Ge Superlattices." Applied Physics Letters. vol. 77. No. 10. pp. 1490-1492.
Ravich. 1995. "Selective Carrier Scattering in Thermoelectric Materials." CRC Handbook of Thermoelectrics. Rowe DM ED. CRC Press, NY. pp. 67-73.
Poudel et al. 2008. "High-Thermoelectric Performance of Nanostructured Bismuth Antimony Telluride Bulk Alloys." Science. vol. 320. pp. 634-638.
Harman et al. 2005. "Nanostructured Thermoelectric Materials." Journal of Electronic Materials. vol. 34.

(Continued)

*Primary Examiner* — Jayne Mershon
(74) *Attorney, Agent, or Firm* — Robert J. Varkonyi; Smith & Hopen, P.A.

(57) ABSTRACT

Thermoelectric elements may be used for heat sensors, heat pumps, and thermoelectric generators. A quantum-dot or nano-scale grain size polycrystalline material the effects of size-quantization are present inside the nanocrystals. A thermoelectric element composed of densified Groups IV-VI material, such as calcogenide-based materials are doped with metal or chalcogenide to form interference barriers form along grains. The dopant used is either silver or sodium. These chalcogenide materials form nanoparticles of highly crystal grains, and may specifically be between 1- and 100 nm. The compound is densified by spark plasma sintering.

24 Claims, 5 Drawing Sheets

(56) References Cited

OTHER PUBLICATIONS

Vashaee et al. 2004. "Electronic and Thermoelectric Transport in Semiconductor and Metallic Superlattices." Journal of Applied Physics. vol. 95. No. 3. pp. 1233-1245.
Mahan et al. 1998. "Multilayer Thermionic Refrigeration." Physical Review Letters. vol. 80. No. 18. pp. 4016-4019.
Harman et al. 2002. "Quantum Dot Superlattice Thermoelectric Materials and Devices." Science. vol. 297. pp. 2229-2232.
Martin et al. 2007. "Thermoelectric Properties of Silicon-Germanium Type I Clathrates." Journal of Applied Physics. vol. 102. pp. 103719-1-103719-6.
Dughaish. 2002. "Lead Telluride as a Thermoelectric Material for Thermoelectric Power Generation." Physica B. vol. 322. pp. 205-223.
Putley. 1952. "Electrical Conductivity in the Compounds PbS, PbSe, PbTe." Proc. Phys. Soc. pp. 388-389.
Poklonski et al. 2003. "A Semiclassical Approach to Coulomb Scattering of Conduction Electrons on Ionized Impurities in Nondegenerate Semiconductors." Journal of Applied Physics. vol. 93. No. 12. pp. 9749-9752.
Seto. 1975. "The Electrical Properties of Polycrystalline Silicon Films." Journal of Applied Physics. vol. 46. No. 12. pp. 5247-5254.
Vigil-Galan et al. 2001. "Influence of the Growth Conditions and Postdeposition Treatments Upon the Grain Boundary Barrier Height of CdTe Thin Films Deposited by Close Space Vapor Transport." J. Appl. Phys. vol. 90. No. 7. pp. 3427-3431.
Kiriakidis et al. 2005. "High Performance Gas Sensing Materials Based on Nanostructured Metal Oxide Films." Rev.Adv.Mater.Sci. vol. 10. pp. 215-223.
Zyubina et al. 2005. "XPS and ab initio Study of the Interaction of PbTe with Molecular Oxygen." Surface Science. vol. 574. pp. 52-64.
Clasen et al. 1983. "Numerical Data and Functional Relationships in Science and Technology." Semiconductors. vol. 17. pp. 170-180.
Mitin. 1985. "Contribution of Light Holes to Thermionic Field Emission in Si and Ge." Physical Review B. vol. 31. No. 4. pp. 2584-2587.
Rogers. 1968. "Drift Mobility of Light-Mass Holes in PbTe Heavily Doped with Na." Brit. J. Appl. Phys. vol. 1. Ser. 2. pp. 1067-1070.
Tritt, T. 2007. "Synthesis and Properties of Nano-Composite Thermoelectric Materials." American Physical Society. APS March Meeting. Denver, CO. Mar. 5-9, 2007. http://meetings.aps.org/link/BAPS.2007.MAR.N43.4.
Urban, J., Talapin, M., Shevchenko, E., Murray, C., and Kanatzidis, M. 2006. "Semiconductor Nanocomposites for Direct Energy Conversion Applications." American Physical Society. APS March Meeting.
Heremans, J. P., Thrush, C. M., and Morelli, D. T. 2004. "Thermopower Enhancement in Lead Telluride Nanostructures." Physical Review B. vol. 70. pp. 11534-1-11534-5.
Cao, Y. Q., Zhu, T. J., Zhao, X. B., Zhang, X. B., and Tu, J. P. 2008. "Nanostructuring and Improved Performance of Ternary Bi-Sb-Te Thermoelectric Materials." Appl. Phys. A. vol. 92. pp. 321-324.
Martin, J., Nolas, G. S., Zhang, W., and Chen, L. 2007. "PbTe Nanocomposites Synthesized from PbTe Nanocrystals." Applied Physics Letters. vol. 90. 222112-1-222112-3.
Brumer, M., Kigel, A., Amirav, L., Sashchiuk, A., Solomesch, O., Tessler, N., and Lifshitz, E. 2005. "PbSe/PbS and PbSe/PbSexS1-x Core/Shell Nanocrystals." Adv. Funct. Mater. vol. 15. pp. 1111-1116.
Peng, X., Schlamp, M. C., Kadavanich, A. V., and Alivisatos, A. P. 1997. "Epitaxial Growth of Highly Luminescent CdSe/CdS Core/Shell Nanocrystals with Photostability and Electronic Accessibilty." J. Am. Chem. Soc. vol. 119. pp. 7019-7029.
Omori, M. 2000. "Sintering, Consolidation, Reaction and Crystal Growth by the Spark Plasma System (SPS)." Materials Science and Engineering. vol. A287. pp. 183-188.
Munir, Z. A., Anselmi-Tamburini, U., and Ohyanagi, M. 2006. "The Effect of Electric Field and Pressure on the Synthesis and Consolidation of Materials: A Review of the Spark Plasma Sintering Method." J. Mater. Sci. vol. 41. pp. 763-777.

Shen, Z., and Nygren, M. 2001. "Kinetic Aspects of Superfast Consolidation of Silicon Nitride Based Ceramics by Spark Plasma Sintering." J. Mater. Chem. vol. 11. pp. 204-207.
Shen, Z., Zhao, Z. Peng, H., and Nygren, M. 2002. "Formation of Tough Interlocking Microstructures in Silicon Nitride Ceramics by Dynamic Ripening." Nature. vol. 417. pp. 266-269.
Lee, Y., and Koyanagi, T. 2001. "Thermoelectric Properties of n-Bi-Sb Sintered Alloys Prepared by Spark Plasma Sintering Method." 20th International Conference on Thermoelectrics. pp. 278-281.
Zhai, P. C., Zhao, W. Y., Li, Y., Liu, S., Tang, X. F., and Zhang, Q. J. 2006. "Nanostructures and Enhanced Thermoelectric Properties in Ce-filled Skutterudite Bulk Materials." Applied Physics Letters. vol. 89. pp. 052111-1-052111-3.
Dresselhaus, M. S., Chen, G., Tang, M. Y., Yang, R., Lee, H., Wang, D., Ren, Z., Fleurial, J., and Gogna, P. 2007. "New Directions for Low-Dimensional Thermoelectric Materials." Adv. Mater. vol. 19. pp. 1043-1053.
Heremans, J. P., Thrush, C. M., and Morelli, D. T. 2005. "Thermopower Enhancement in PbTe with Pb Precipitates." Journal of Applied Physics. vol. 98. pp. 063703-1-063703-6.
Kishimoto, K., and Koyanagi, T. 2002. "Preparation of Sintered Degenerate n-Type PbTe with a Small Grain Size and its Thermoelectric Properties." Journal of Applied Physics. vol. 92. No. 5. pp. 2544-2549.
Vashaee, D., and Shakouri, A. 2004. "Improved Thermoelectric Power Factor in Metal-Based Superlattices." Physical Review Letters. vol. 92. No. 10. pp. 106103-1-106103-4.
Moyzhes, B. and Nemchinsky, V. 1998. "Thermoelectric Figure of Merit of Metal-Semiconductor Barrier Structure Based on Energy Relaxation Length." Applied Physical Letters. vol. 73. No. 13. pp. 1895-1897.
Whitlow, L. W. and Hirano, T. 1995. "Superlattice Applications to Thermoelectricity." J. Appl. Phys. vol. 78. No. 9. pp. 5460-5466.
Heremans, J. P., Thrush, C. M., Morelli, D. T., and Wu, M. 2002. "Thermoelectric Power of Bismuth Nanocomposites." Physical Review Letters. vol. 88. No. 21. pp. 216801-1-216801-4.
Hicks, L. D., and Dresselhaus, M. S. 1993. "Effect of Quantum-Well Structures on the Thermoelectric Figure of Merit." Physical Review B. vol. 47. No. 19. pp. 12727-12731.
Bhattacharya, S., Tritt, T. M., Xia, Y., Ponnambalam, V., Poon, S. J., and Thadhani, N. 2002. "Grain Structure Effects on the Lattice Thermal Conductivity of Ti-Based Half-Heusler Alloys." Applied Physics Letters. vol. 81. No. 1. pp. 43-45.
Nolas, G. S., and Goldsmid, H. J. 2002. "The Figure Merit in Amorphous Thermoelectrics." Phys. Stat. Sol. (a). vol. 194. No. 1. pp. 271-276.
Sharp, J. W., Poon, S. J., and Goldsmid, H. J. 2001. "Boundry Scattering and the Thermoelectric Figure of Merit" Phys. Stat. Sol. (a). vol. 187. No. 2. pp. 507-516.
Kosuga, A., Uno, M., Kurosaki, K., and Yamanaka, S. 2005. "Thermoelectric Properties of Stoichiometric Ag1-xPb18SbTe20 (x=0, 0.1. 0.2)." Journal of Alloys and Compounds. vol. 391. pp. 288-291.
Hsu, K. F., Loo, S., Guo, F., Chen, W., Dyck, J. S., Uher, C., Hogan, T., Polychroniadis, E. K., and Kanatzidis, M. G. 2004. "Cubic AgPbmSbTe2+m: Bulk Thermoelectric Materials with High Figure of Merit." Science. vol. 303. pp. 818-821.
Nolas, G. S., Morelli, D. T., and Tritt, T. M. 1999. "Skutterudites: A Phonon-Glass-Electron Crystal Approach to Advanced Thermoelectric Energy Conversion Applications." Annu. Rev. Mater. Sci. vol. 29. pp. 89-116.
Zhu, T. J., Yan, F., Zhao, X. B., Zhang, S. N., Chen, Y., and Yang, S. H. 2007. "Preparation and Thermoelectric Properties of Bulk in Situ Nanocomposites with Amorphous/Nanocrystal Hybrid Structure." J. Phys. D: Appl. Phys. vol. 40. pp. 6094-6097.
Mi, J. L., Zhao, X. B., Zhu, T. J., and Tu, J. P. 2007. "Improved Thermoelectric Figure of Merit in N-Type CoSb3 Based Nanocomposites." Applied Physics Letters. vol. 91. pp. 172116-1-172116-3.
Ni, H. L., Zhao, X. B., Zhu, T. J., Ji, X. H., Tu, J. P. 2005. "Synthesis and Thermoelectric Properties of Bi2Te3 Based Nanocomposites." Journal of Alloys and Compounds. vol. 397. pp. 317-321.

(56) References Cited

OTHER PUBLICATIONS

Murray, C. B., Kagen, C. R., and Bawendi, M. G. 2000. "Synthesis and Characterization of Monodisperse Nanocrystals and Close-Packed Nanocrystal Assemblies." Annu. Rev. Mater. Sci. vol. 30. pp. 545-610.

Martin, J., Nolas, G. S., Zhang, W., and Chen, L. 2007. "PbTe Nanocomposites Synthesized from PbTe Nanocrystals." Applied Physics Letters. vol. 90. pp. 222112-1-222112-3.

Zhang, W., Zhang, L., Cheng, Y., Hui, Z., Zhang, X., Xie, Y., and Qian, Y. 2000. "Synthesis of Nanocrystalline Lead Chalcogenides PbE (E=S, Se, or Te) from Alkaline Aqueous Solutions." Materials Research Bulletin. vol. 35. pp. 2009-2015.

Crocker, A. J., and Rogers, L. M. 1967. "Interpretation of the Hall Coefficient, Electrical Resistivity and Seebeck Coefficient of P-Type Lead Telluride." Brit, J. Appl. Phys. vol. 18. pp. 563-573.

Harman, T. C., Taylor, P. J., Walsh, M. P., and Laforge, B. E. 2002. "Quantum Dot Superlattice Thermoelectric Materials and Devices." Science. vol. 297. pp. 2229-2232.

Venkatasubramanian, R., Siivola, E., Colpitts, T. and O'Quinn, B. 2001. "Thin-Film Thermoelectric Devices with High Room-Temperature Figures of Merit." Nature. vol. 413. pp. 597-602.

Saramat, A., Svensson, G., Palmqvist, A. E. C., Stiewe, C., Mueller, E., Platzek, D., Williams, S. G. K., Rowe, D. M., Bryan, J. D., and Stucky, G. D. 2006. "Large Thermoelectric Figure of Merit at High Temperature in Czochralski-Grown Clathrate Ba8Ga16Ge30." Journal of Applied Physics. vol. 99. pp. 023708-1-023708-5.

Sales, B. C., Mandrus, D., and Williams, R. K. 1996. "Filled Skutterudite Antimonides: A New Class of Thermoelectric Materials." Science. vol. 272. pp. 1325-1328.

Uher, C. 2002. "In Search of Efficient N-Type Skutterudite Thermoelectrics." 21st International Conference on Thermoelectronics. pp. 35-41.

Nolas, G. S., Slack, G. A., and Schujman, S. B. 2001. "Semiconductor Clathrates: A Phonon Glass Electron Crystal Material with Potential for Thermoelectric Applications." Semiconductors and Semimetals. vol. 69. pp. 255-300.

Nolas, G. S. 2005. "Structure, Transport and Thermoelectric Properties of Clathrate Compounds." Thermoelectrics Handbook: Macro to Nano-Structured Materials. pp. 33-1-33-8.

Wang, H., Li, J., Nan, C., Zhou, M., Liu, W., Zhang, B., and Kita, T. 2006. "High-Performance Ag0.8Pb18 +xSbTe20 Thermoelectric Bulk Materials Fabricated by Mechanical Alloying and Spark Plasma Sintering." Applied Physics Letters. vol. 88. pp. 092104-1-092104-3.

Dresselhaus, M. S., Chen, G., Tang, M. Y., Yang, R. G., Lee, H., Wang, D. Z., Ren, Z. F., Fleurial, J. P., and Gogna, P. 2006. "New Directions for Nanoscale Thermoelectric Materials Research." Proc. Mater. Res. Soc. vol. 886.

Lan, et al.; "Enhancement of Thermoelectric Figure-of-Merit by a Bulk Nanostructuring Approach"; Advanced Functional Materials; vol. 20, pp. 357-376; 2010.

Martin, et al.; "PbTe Nanocomposites Synthesized From PbTe Nanocrystals"; Applied Physics Letters; vol. 90 222112-1-3; 2007.

Martin, et al.; "Enhanced Seebeck Coefficient Through Energy-Barrier Scattering in PbTe Nanocomposites"; Physical Review B; vol. 79; 115311-1-5; 2009.

Popescu; et al.; "Model of Transport Properties of Thermoelectric Nanocomposite Materials"; Physical Review B; vol. 79; 205302-1-7; 2009.

Sootsman, et al.; "New and Old Concepts in Thermoelectric Materials"; Angew. Chem. Int. Ed.; vol. 48, pp. 8616-8639; 2009.

\* cited by examiner

US 8,759,662 B1

BULK DIMENSIONAL NANOCOMPOSITES FOR THERMOELECTRIC APPLICATIONS

STATEMENT OF GOVERNMENT INTEREST

This invention was made with Government support under Grant No. DE-PS26-04NT42113 awarded by the Department of Energy and Grant No. W81XWH-07-1-0708 awarded by the Department of Defense, U.S. Army Medical Research and Materiel Command. The Government has rights in the invention.

CROSS REFERENCE TO RELATED APPLICATION

This application claims priority to U.S. Provisional Patent Application No. 61/041,748, entitled "Thermoelectric Nanocomposites and Manufacturing Method", filed on Apr. 2, 2008, the contents of which are herein incorporated by reference.

FIELD OF INVENTION

This invention relates to enhancing thermoelectric properties of devices. Specifically, the invention entails using nanoscale fabrication on thermoelectric materials to improve the efficiency of thermoelectric devices.

BACKGROUND OF THE INVENTION

The demand for new technologies to enhance the efficiency of our Nation's automobiles is at the forefront of new materials research towards power conversion technologies. Thermoelectric (TE) elements have been used as heat sensors for temperature measurement, heat pumps in applications with low power demand or where compression refrigerating systems cannot be used for other reasons, and in thermoelectric generators (TEG). However, unit costs are relatively high and the efficiency too low in TEGs, to allow for general commercialization of TE devices. There exists a vast array of potential applications for TE elements due to decreasing energy resources and increasing energy demand. TE power conversion from exhaust, "waste", heat is a viable technology that can be instrumental in improving the efficiency, and thus reducing emitted pollutants, of our nation's automobiles. Because TE devices can translate heat flow into electrical current, thermoelectric generators may be used as a renewable energy source in automotive fuel economy, electricity generation. TE technology is advantageous in many respects, including reliability (no moving parts), safety and environmental friendliness. When a temperature gradient is maintained across a TE device electric potential is generated, due to the Seebeck effect, which can be used to drive a "load", or generator.

Research into higher efficiency thermoelectric (TE) materials continues to require advanced synthesis techniques. The specific material property requirements for TE materials can be quantified by the dimensionless figure of merit, $ZT=S^2 \sigma/\kappa$ where S is the Seebeck coefficient, $\sigma$ the electrical conductivity and $\kappa$ the total thermal conductivity ($\kappa=\kappa_L+\kappa_e$; the lattice and electronic contributions, respectively). The power factor, $S^2\sigma$ or $S^2/\rho$ where $\rho$ is the electrical resistivity, is typically optimized as a function of carrier concentration (typically $\sim 10^{19}$ carriers/cm$^3$ in materials presently available in devices), through doping, to give the largest ZT. The current TE materials used in devices are rather inefficient, $ZT\approx 1$, even though they are able to address many niche applications.

In order that TE devices achieve their full potential, new materials and new material synthesis approaches are needed. Materials with larger values of ZT warrant better thermoelectric devices, thus researchers have devoted much effort in finding ways to increase ZT. Since the transport properties that define ZT are interrelated, it is difficult to control them independently for a three-dimensional crystal.

The thermoelectric potential, which determines the electrical voltage that can be generated, depends on the material-specific thermoelectric characteristics based on the Seebeck coefficient and temperature differences. High Seebeck coefficients and large temperature differences lead to high thermoelectric voltages. In order to be able to draw large electrical power, a large temperature difference must be maintained between the elements of a TE device. This necessitates the use of bulk materials with high Seebeck coefficients. With the present methods for manufacturing TE elements, either it is not possible in practice to manufacture such bulk materials or the manufacture of such bulk TE elements would lead to exorbitant manufacturing costs.

Recent research on TE materials has resulted in ZT values greater than unity at different temperatures of application, due to the advanced material synthesis, characterization and modeling capabilities developed. Several classes of materials have added to these advances. These include bulk materials such as skutterudites and clathrates (G. S. Nolas, et al., "Skutterudites: A phonon-glass-electron-crystal approach to advanced thermoelectric energy conversion applications", Ann Rev. Mat. Res. 29, 8. (1999); C. Uher, "Skutterudites: Perspective novel materials" in *Semiconductors and Semimetals* 69, 139 (2000); B. C. Sales, et al., "Filled skutterudite antimonides: A new class of thermoelectric materials", *Science* 272, 1325 (1996); G. S. Nolas, et al., "Semiconductor Clathrates: A phonon-glass electron-crystal material with potential for thermoelectric applications", in *Semiconductors and Semimetals*, Vol. 69, edited by T. M. Tritt, Academic Press, 2000, p. 255; G. S. Nolas, "Structure, transport and thermoelectric properties of clathrate compounds", in *Thermoelectrics Handbook: Macro to Nano-Structured Materials*, edited by D. M. Rowe, CRC Press, Boca Raton, Fla., 2005, 33-1; A. Saramat, et al. "Large thermoelectric figure of merit at high temperature in Czochralski-grown clathrate $Ba_8Ga_{16}Ge_{30}$", J. Appl. Phys. 99, 023708 (2006), and complex chalcogenides (M. G. Kanatzidis, "The role of solid-state chemistry in the discovery of new thermoelectric materials" in *Semiconductors and Semimetals* 69, 51 (2000)) with unique crystal structures allowing for low $\kappa_L$, and therefore enhanced thermoelectric properties.

Additionally, research and development in nanotechnology has shown promising improvements in Seebeck coefficient with new TE materials. The controlled fabrication of nanoscale semiconductors with enhanced physical properties is a current goal of technical as well as fundamental interest. Thin-film coatings and nanotube technology allows production of two-dimensional or one-dimensional thermoelectric structures with improved TE characteristics compared to traditional "bulk" materials, but still do not solve the problem of manufacturing bulk materials that are inexpensive. Nevertheless, nanostructured materials have become of great interest because they offer the opportunity of independently varying the transport properties that define ZT (G. S. Nolas, J. Sharp, and H. J. Goldsmid, *Thermoelectrics: Basic Principles and New Materials Developments* (Springer, New York, 2001); G. Chen, M. S. Dresselhaus, G. Dresselhaus, J. P. Fleurial, and T. Caillat, *International Materials Review*, Vol. 48 (London, 2003), p. 45-66).

Semiconductor grain boundaries on carrier transport becomes increasingly important in nanoscale polycrystalline systems, where surface, point defect, dislocation, and interfacial energy barrier scatterings can dominate the transport (G. Blatter and F. Greuter, Phys. Rev. B 34, 8555 (1986); H. Marom, M. Ritterband, M. Eizenberg, Thin Solid Films 510, 62 (2006); C. H. Seager, J. Appl. Phys. 52, 3960 (1981)). Recent identification of several higher efficiency thermoelectric (TE) materials can be attributed to nanoscale enhancement (M. S. Dresselhaus, G. Chen, M. Y. Tang, R. Yang, H. Lee, D. Wang, Z. Ren, J. P. Fleurial, and P. Gogna, Adv. Mater. 19, 1043 (2007); L. D. Hicks, M. S. Dresselhaus, Phys. Rev. B 47, 16631 (1993); J. P. Heremans, C. M. Thrush and D. T. Morelli, J. Appl. Phys. 98, 063703 (2005); K. F. Hsu, S. Loo, F. Guo, W. Chen, J. S. Dyck, C. Uher, T. Hogan, E. K. Polychroniadis, M. G. Kanatzidis, Science 303, 818 (2004); M. S. Dresselhaus, G. Chen, M. Y. Tang, R. G. Yang, H. Lee, D. Z. Wang, Z. F. Ren, J. P. Fleurial and P. Gogna, *Proc. Mater. Res. Soc.* 886 3 (2006)). These materials demonstrate increased Seebeck coefficient and decreased thermal conductivity due to the phenomenological properties of nanometer length scales, including enhanced interfacial phonon scattering and charge carrier filtering.

Nanometer-scale materials have been at the core of one of the most substantial advances in thermoelectric technology since the development of semiconductor technology (*Materials and Technologies for Direct Thermal-to-electrical Energy Conversion*, Mater. Res. Soc. Proc. Vol. 886, edited by J. Yang. T. P. Hogan, R. Funahachi and G. S. Nolas, 2006)). The two mechanisms that led to this success were a strong reduction in $\kappa_L$ and an increase in $S^2\sigma$. The reduction in $\kappa_L$ can be understood as a function of phonon mean-free-path (J. W. Sharp, et al., "Boundary Scattering of Phonons and thermoelectric figure of merit", Physica Status Solidi (a) 187, 507 (2001); G. S. Nolas and H. J. Goldsmid, "The Figure of Merit in Amorphous Thermoelectrics", Physica B 194, 271 (2002); S. Bhattacharya, et al., "Grain Structure Effects on the Lattice Thermal Conductivity of Ti-Based Half-Heusler Alloys", Appl. Phys. Lett. 81, 43 (2002)). Quantum confinement results in a strongly increased Seebeck coefficient due to the increase in the density-of-states of the carriers (L. D. Hicks and M. S. Dresselhaus, "Effect of quantum-well structures on the thermoelectric figure of merit", Phys. Rev. B 47, 12727 (1993)). This observation was at the origin of the interest in nanoscale thermoelectricity and experimentally observed on bismuth nanowires (J. P. Heremans, et al., "Thermoelectric Power of Bismuth Nanocomposites", Phys. Rev. Lett. 88, 216801 (2002)).

Nanostructured TE enhancement aims to 'split' the interdependence of the electrical and thermal transport, allowing for better optimization of the TE figure of merit (G. S. Nolas, et al., *Thermoelectrics: Basic Principles and New Materials Developments* (Springer, New York, N.Y., 2001)). The reduction of $\kappa_L$ through the interface scattering of phonons in nanostructured materials has been viewed as the primary way to increase ZT (M. S. Dresselhaus, et al., "New Directions for Low-Dimensional Thermoelectric Materials", Adv. Mater. 19, 1043 (2007); R. Venkatasubramanian, et al., "Thin-film thermoelectric devices with high room-temperature figures of merit", Nature 413, 597 (2001); T. C. Harman, et al., "Quantum Dot Superlattice Thermoelectric Materials and Devices", Science 297, 2229 (2002); T. Koga, et al., "Experimental proof-of-principle investigation of enhanced $Z_{3D}T$ in (001) oriented Si/Ge superlattices", Applied Physics Letters 77, 1490 (2000)). The particular mechanism is the effective scattering of phonons due to the presence of interfaces.

Superior TE performance requires enhancement of the power factor ($S^2/\rho$). Carrier filtering, where the presence of interfacial energy barriers filters low energy charge carriers traversing the interface, has been theoretically predicted (Y. I. Ravich, In *CRC Handbook of Thermoelectrics*, edited by D. M. Rowe, pages 67-73, CRC Press, New York, (1995); B. Moyzhes and V. Nemchinsky, Appl. Phy. Lett. 73, 1895 (1998)). This increases ISI, as its value depends on the mean carrier energy relative to the Fermi level (G. S. Nolas, J. Sharp, and H. J. Goldsmid, *Thermoelectrics: Basic Principles and New Materials Developments* (Springer, New York, N.Y., 2001)).

Carrier scattering at the boundaries that inhibits the conduction of low-energy charge carriers thus causing an overall increase in S was first proposed theoretically, (L. W. Whitlow and T. Hirano, "Superlattice applications to thermoelectricity", J. Appl. Phys. 78, 5460 (1995); Moyzhes and V. Nemchinsky, "Thermoelectric figure of merit of metal-semiconductor barrier structure based on energy relaxation length", Appl. Phys. Lett. 73, 1895 (1998)) and has been experimentally investigated in III-V heterostructures (D. Vashaee and A. Shakouri, "Improved thermoelectric power factor in metal-based superlattices", Phys. Rev. Lett. 92, 106103 (2004)). Very little experimental research effort has been undertaken into the investigation of $S^2\sigma$ enhancement of nano-scale inclusions in bulk materials. Research on PbTe, (K. Kishimoto and T. Koyanagi, "Preparation of sintered degenerate n-type PbTe with a small grain size and its thermoelectric properties", J. Appl. Phys. 92, 2544 (2002); J. P. Heremans, et al., "Thermopower enhancement in lead telluride nanostructures", Phys. Rev. B 70, 115334 (2004)) Si—Ge alloys (M. S. Dresselhaus, et al., "New directions for nanoscale thermoelectric materials research", Proc. Mater. Res. Soc. 886, 3 (2006)) $Bi_2Te_3$ (B. Poudel et al, "High-Thermoelectric Performance of Nanostructured Bismuth Antimony Telluride Bulk Alloys", Science 320, 634 (2008)) and Ce-filled skutterudites with "unfilled" skutterudite nano-grains (P. C. Znai, et al., "Nanostructures and enhanced thermoelectric properties in Ce-filled skutterudite bulk materials", Appl. Phys. Lett. 89, 052111 (2006)) have shown an improvement in S as compared to their bulk counterparts. These studies, however, have not fully developed the physics behind the underlying phenomena affecting the transport properties as a function of grain size. In all five of these studies the ball-milling technique that was used to synthesize nanoscale powders of the respective materials causes strain in these materials that surely affected their transport properties as compared to hot pressed (HP) sintered bulk polycrystalline specimens. This was specifically noted in the work of Heremans et al. ("Thermopower enhancement in lead telluride nanostructures", Phys. Rev. B 70, 115334 (2004)). The affect on nano-feature size is therefore not well established from these studies. More recently a study by Heremans et al. ("Thermoelectric enhancement in PbTe with Pb precipitates", J. Appl. Phys. 98, 063703 (2005)) showed an increase in S due to 3 and 6% nano-grain Pb precipitates. Most recently, we have synthesized and measured the transport properties of polycrystalline PbTe with 100 nm PbTe inclusions and showed enhanced S with minimal degradation in a as compared to bulk polycrystalline PbTe (A. J. Crocker and L. M. Rogers, Brit. "Interpretation of the Hall coefficient, electrical resistivity and Seebeck coefficient of p-type lead telluride", J. Appl. Phys. 18, 563 (1967)).

SUMMARY OF THE INVENTION

In a quantum-dot or nano-scale grain size polycrystalline material the effects of size-quantization is present inside the nanocrystals. However, experimental studies involving bulk thermoelectric materials with nanostructure inclusions or granular nanocomposites indicated that TE property improvements for bulk nanocrystalline materials are feasible (K. Kishimoto and T. Koyanagi, J. Appl. Phys. 92, 2544 (2002); J. P. Heremans, C. M. Thrush, and D. T. Morelli, Physical Review B 70, 115334 (2004); J. Martin, G. S. Nolas, W. Zhang, and L. Chen, Appl. Phys. Lett. 99, 222112 (2007)). These studies have suggested that the thermoelectric properties can be enhanced by increasing $S^2\sigma$. The physical mechanism responsible for S enhancement in these materials has not been developed. It has been demonstrated that PbTe/PbTeSe quantum dot superlattices can have a two-fold increase in room temperature ZT as compared to bulk PbTe (T. C. Harman, P. J. Taylor, M. P. Walsh, and B. E. LaForge, Science 297, 2229 (2002); T. C. Harman, M. P. Walsh, B. E. LaForge, and G. W. Turner, J. Electron. Mat. 34, L19 (2005)). Additionally, materials containing PbTe nanogranular formations (J. P. Heremans, C. M. Thrush, and D. T. Morelli, Phys. Rev. B 70, 115334 (2004); J. Martin, G. S. Nolas, W. Zhang, and L. Chen, Appl. Phys. Lett. 90, 222112 (2007) or Si and Ge nanoparticles have also been shown to exhibit an increase in ZT.

Experimental studies indicate that the carrier scattering at the interfaces may be an important factor in the overall increase in ZT. In particular, it is speculated that for polycrystalline materials the grains appear as traps for low energy carriers, while the higher energy carriers diffuse trough the specimen (Y. I. Ravich, *CRC Handbook of Thermoelectrics*, (CRC Press, New York, 1995). In fact, the enhancement of the TE properties in nanocomposites has been attributed to the presence of carrier/interface potential barrier scattering mechanism, which is not typical for bulk materials. The grain boundaries therefore appear to filter out the lower energy carriers. Since the mean energy per carrier is increased, S increases while σ is not degraded significantly. Filtering by energy barriers has been theoretically predicted and experimentally observed in thin films and heterostructure systems (D. Vashaee and A. Shakouri, Phys. Rev. Lett. 92, 106103 (2004); D. Vashaee and A. Shakouri, J. of Appl. Phys. 95, 1233 (2004); G. D. Mahan and L. M. Woods, Phys. Rev. Lett. 80, 4016 (1998)).

The thermoelectric properties may be altered by approaching nano-scale dimensions. These include superlattice structures of $Bi_2Te_3/Sb_2Te_3$, (R. Venkatasubramanian, et al., "Thin-film thermoelectric devices with high room-temperature figures of merit", Nature 413, 597 (2001)) PbSeTe/PbTe, and PbTe thin films that contain nanodots of PbSe. (T. C. Hannan, et al., "Quantum Dot Superlattice Thermoelectric Materials and Devices", Science 297, 2229 (2002)). Nanodots of PbTe can form inside $Ag_mPb_mSbTe_{m+2n}$ crystals with ZT~1.7. (K. F. Hsu, et al., "Cubic $AgPb_mSbTe_{2+m}$: Bulk Thermoelectric Materials with High Figure of Merit", Science 303, 818 (2004); H. Wang, et al., "High-performance $Ag_{0.8}Pb_{18+x}SbTe_{20}$ thermoelectric bulk materials fabricated by mechanical alloying and spark plasma sintering", Appl. Phys. Lett. 88,092104 (2006); A. Kosuga, M. Uno, K. Kurosaki, S. Yamanaka, "Thermoelectric properties of Stoichiometric $Ag_{1-x}Ph_{18}SbTe_{20}$ (x=0, 0.1, 0.2)", J. Alloys & Comp 391, 288 (2005)) In most of the present research the effort focuses on reducing κ to increase ZT.

In certain embodiments, a thermoelectric element composed of densified Groups IV-VI material. For example, chalcogenide-based materials, such as PbTe, are useful. A metal or chalcogenide dopant is integrated into the chalcogenide forming nanoparticles such that interference barriers form along grains. The dopant is either silver or sodium in specific embodiments.

In certain embodiments, the Group IV-VI materials are chalcogenide. These chalcogenide materials are optionally nanoparticles of highly crystal grains, and may specifically be between 1 and 100 nm. The chalcogenide nanoparticles may be $Bi_2Te_3$, $Sb_2Te_3$, PbSeTe, PbTe, CdS CdSe, ZnSe, ZnS, CsS, PbS, or $PbSe_xS_{1-x}$. In specific embodiments, the nanocrystals are PbTe particles ranging in size from 100-150 nm. The chalcogenide nanoparticles can also be core-shell nanocrystals with a metal dopant core and semiconducting coating in specific embodiments. The semiconducting compound is optionally densified by spark plasma sintering.

The thermoelectric element may be used for heat sensors, heat pumps, and thermoelectric generators and may specifically be a thermoelectric generator adapted for use on an automobile.

A phenomenological model is proposed to describe the diffusion transport of carriers through a material composed of nanogranular regions. The material is viewed as containing potential interface barriers due to the grains, and the transport includes quantum transmission through and reflection from those barriers. Additional scattering mechanisms, such as carriers/acoustic phonons, carriers/non-polar optical phonons, and carriers/ionized impurities, which are relevant for thermoelectric materials, are also taken into account. The model involves a set of physical parameters which can be measured independently or taken from the literature to calculate or make predictions for the transport characteristics for relevant thermoelectrics or define grain barrier characteristics, such as height, width and distance between them, and predict grain barrier influence on thermoelectric transport. The model is tested by comparing the calculated carrier conductivity and thermopower to experimental data for PbTe dimensional nanocomposites.

A nanofabricated thermoelectric may be created using at least one semiconducting Groups IV-VI element. A metal or chalcogenide dopant is mixed with the semiconducting compound, forming nanoparticles of dopant and semiconducting material. The material is then densified. The nanoparticles are optionally formed by ultrasonic homogenizer. In specific embodiments, the dopant-semiconducting material is densified by spark plasma sintering or hot pressing In some embodiments, the dopant is dissolved in the lead acetate. In certain embodiments, the dopant may be silver or sodium, and may specifically be silver acetate.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
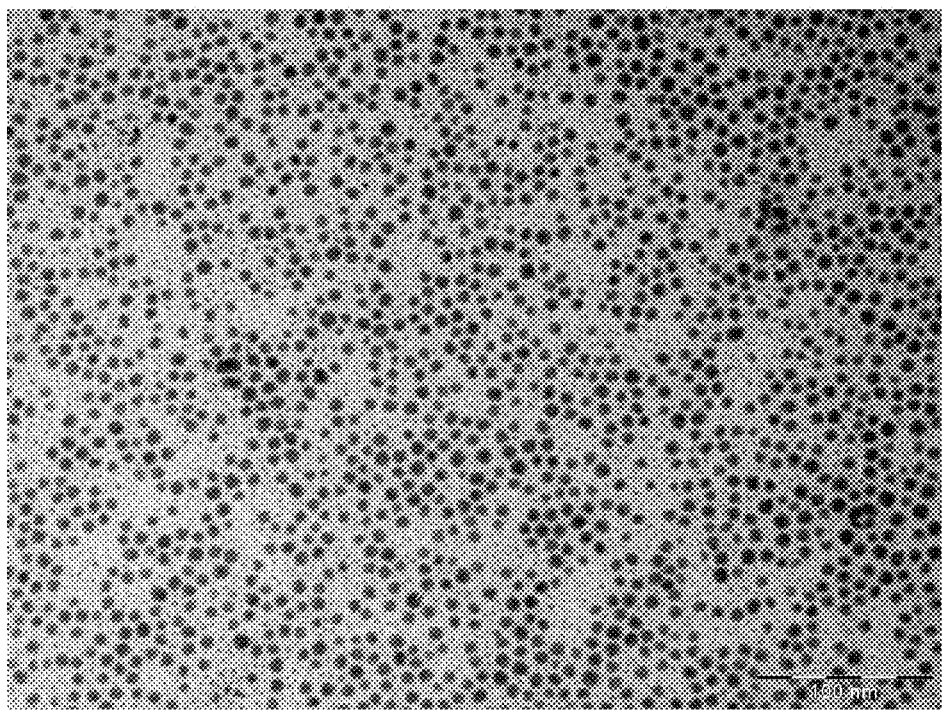
FIG. 1 is a transmission electron micrograph of $Bi_2Te_3$ nano-sphere semiconductors.

A model for describing the diffusive transport properties in granular nanocomposite materials is proposed and successfully applied to explain relevant experimental data. The interfaces of the nano-scaled granular regions are modeled as rectangular barriers. The transport through the material includes carrier quantum mechanical transmission and scattering from the barriers, carrier/phonon and carrier/ionized impurities scattering within the grains. The theoretically calculated $\sigma$ and S can reproduce the experimental observations obtained for Ag-doped PbTe and undoped PbTe nanocomposite specimens. We have shown that the interplay between the different scattering mechanisms, as well as the carrier concentration and the physical parameters for the barriers, are important in finding an optimal regime for the TE performance of a given material. Specifically, our model reveals that by manipulating the barrier size and height, the mean energy per carrier may be increased leading to an increase in S without substantial degradation of $\sigma$. Furthermore, this model can be adapted, within the relaxation time approximation, for other IV-VI material systems composed of highly crystalline grains by incorporating the relevant physical parameters in the total density of states and scattering mechanisms.

As used herein, the term "Group IV-VI" refer to compounds located at locations IVA through VIA on the periodic table. These include semiconducting materials, and specifically chalcogenides.

As used herein, the term "nanoparticle" means one or more nanoparticles with an average diameter ranging from 1 to 100 nm.

As used herein, the term "dopant" means an element, compound or compounds which provide a substantial number of shallow donor or acceptor levels in the semiconductor material so as to substantially alter the conductivity of the material. Exemplary dopants are metal or chalcogenides, such as silver or sodium. Those of skill in the art will understand that other dopant compounds or elements exist for use in the semiconductor materials.

TE samples were synthesized employing solution phase and sonochemical synthesis methods. The samples were then characterized structurally, chemically, electrically and thermally for evaluation of the materials properties. Core-shell nanocrystals permit manipulation of physical parameters by forming metallic and semiconducting coatings around the nanocrystals to produce additional quantum confined states at these interfaces. A solution phase synthesis approach is the best approach in producing large batches of phase-pure nanoscale powders of chalcogenides. Chalcogenide compounds lend themselves to the development of core-shell nanocrystalline-bulk composite materials synthesis. The approach has been previously described (C. B. Murray, et al., "Synthesis and characterization of monodisperse nanocrystals and closed-packed nanocrystal assemblies", Annu. Rev. Mater. Sci. 30, 545 (2000)) and is optimized to produce large quantities of PbTe and PbSe nanocrystals required for the nanocomposite formation.

PbTe was used as an exemplary material however other nanocomposites are envisioned. Without limiting the invention, examples include semiconductor-semiconductor composites, metal-metal composites, and metal-non-metal composites, such as PbSe, PbSe—PbTe, $SbTe_2$—PbTe, $AgSbTe_2$—PbSe, and alloys of PbTe and PbSe such as $PbSn_xSe_{1-x}$.

Integration of core-shell nanocrystals into bulk materials suggests new possibilities for 'tuning' interfacial energy barriers and observing the affect on the transport properties. Core-shell nanocomposite thermoelectric materials may reduce the carrier mobility thus having the potential to degrade the thermoelectric properties, although the potential increase in S may more than offset this degradation.

Monodisperse nanocrystals were produced using solution phase synthesis and sonochemical methods. Nano-spheres of PbTe or PbSe were synthesized using solvent techniques employing a low temperature reaction of tellurium, for PbTe or selenium for PbSe, in alkaline aqueous solutions with a lead acetate trihydrate solution. Large yields of nano-sphere semiconductors were obtained in up to 10 grams per batch, shown in FIG. 1. It is noted that large batch sizes are a prerequisite in synthesizing bulk quantities of thermoelectric materials.

Structural, microscopic and chemical analyses of the desired materials were undertaken, including x-ray diffraction and electron diffraction analysis for structural characterization. Tunneling Electron Microscopy (TEM) was used to study nano-grain size and structure as well as inter-grain regions in the compacted materials, and to monitor and characterize the presence of any disordered or other extraneous phases resulting from localized deformation at inter-particle regions. SEM with energy dispersive spectroscopy permitted analysis of grain size, composition and composite uniformity.

Figure 2:
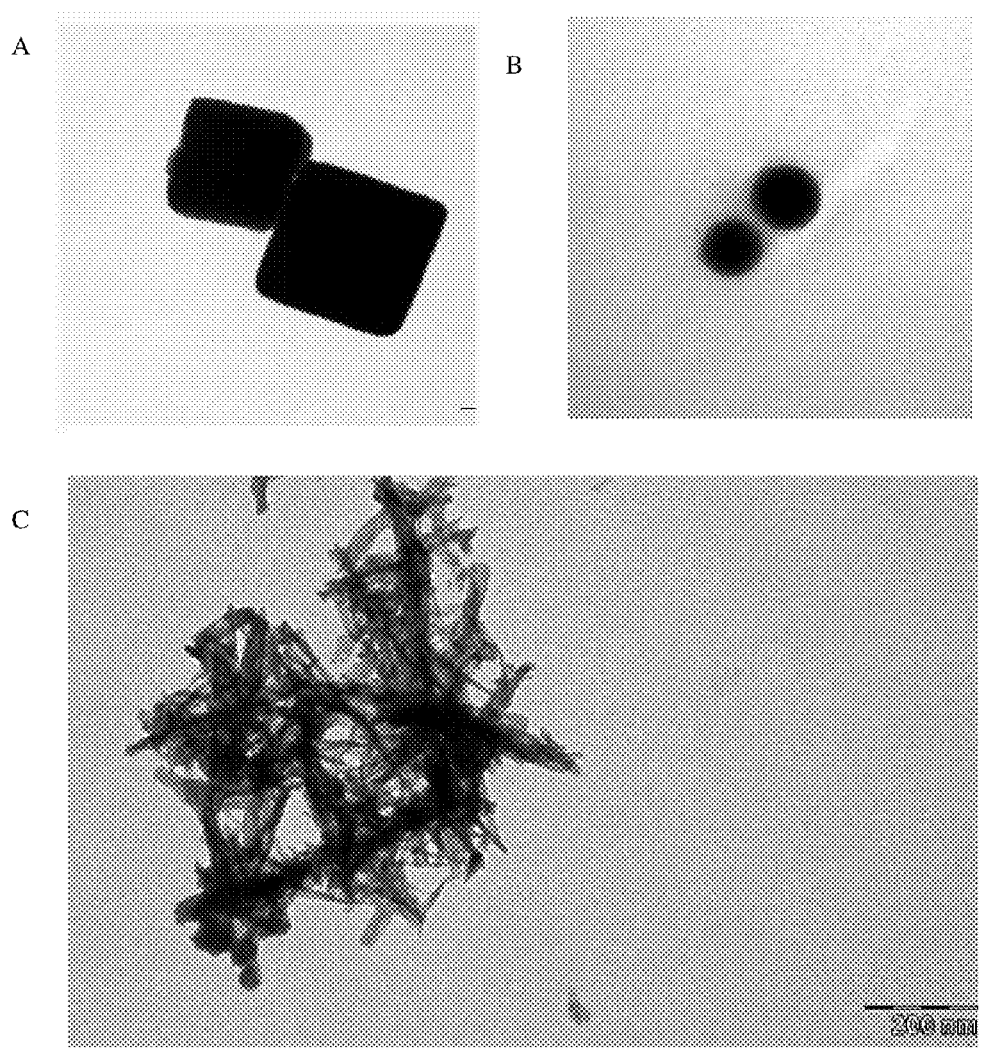
FIGS. 2(a)-(c) are a transmission electron micrographs of typical PbTe nanoparticles. (A) spherical nanoparticles of dimensions ~100 nm and (b) cuboid nanoparticles of 100-150 nm were generated by adjusting ultrasonic pulsing and lead acetate used. (C) Increasing the ultrasonic duration induced growth of nanorods.

FIG. 2 shows transmission electron micrographs of typical nanoparticles of dimensions ~100 (spheres) and 100-150 nm (cubes). Syntheses that modify the morphology and yield through sonochemical reactions were also performed. A 300 W ultrasonic homogenizer (Biologics 300 V/T) with a 0.75 inch titanium horn placed in the alkaline aqueous solution prior to the addition of the lead acetate trihydrate solution, promoted the growth of smaller crystallites with homogenous distribution of nanocrystallite diameters. The adjustable parameters, including power intensity, duration, intermittent duration, and precursor concentration, modify the size and shape of the nanocrystals. For example, increasing the ultrasonic duration can also induce the growth of nanorods, seen in FIG. 2. Reacting with much less (10×) lead acetate trihydrate concentration solutions in a 50% intermittent ultrasonic pulse cycle resulted in less aggregated nanoparticles with distinctly cubic morphologies, as seen in FIG. 1. Adjustments in pulse duration and concentration of lead acetate trihydrate resulted in spherical shapes down to 10 nm in diameter, allowing adjustment of shape; cuboid, spherical, and nanorods; and size from 10 nm to several hundred nanometers in size.

Hot Pressing (HP) of powders has been the mainstay of densification of polycrystalline materials for thermoelectrics applications. Spark Plasma Sintering (SPS) was used to densify composites with nanocrystals 100 nm. SPS utilizes a direct electrical current, or a pulse of electric current, applied to the graphite punch-and-die set which passes through the sample, thereby heating both the outside and inside of the sample simultaneously. This process generates internal localized heating and allows for the rapid, low temperature, densification of fine grained powders (M. Omori, "Sintering, consolidation, reaction and crystal growth by the spark plasma system (SPS)", Mater. Sci. & Eng. A287, 183 (2000); Z. A. Munir, et al., "The effect of electric field and pressure on the synthesis and consolidation of materials: A review of the spark plasma sintering method", J. Mater. Sci. 41, 763 (2006)) and has been used for fine-grain densification of thermoelectric alloys, such as BiSb and $Bi_2Te_3$, resulting in lower $\kappa_L$ while maintaining excellent electrical properties. In addition the grains possessed orientational direction, as required for optimization in BiSb and $Bi_2Te_3$ (Y. Lee and T. Koyanagi, "Thermoelectric Properties of n-Bi—Sb Sintered Alloys Prepared by Spark Plasma Sintering Method", in *The 20th International Conference on Thermoelectrics: ICT Symposium Proceedings,* 2001, p. 279). Long-distance mass diffusion is restricted during the SPS process, thus phase formation is determined by local chemistry, allowing for phase assembly far from equilibrium and avoiding the formation of transient phases (Z. Shen and M. Nygren, "Kinetic aspects of superfast consolidation of silicon nitride based ceramics by spark plasma sintering", J. Mater. Chem. 11, 204 (2001); Z. Shen, et al., "Formation of tough interlocking microstructures in silicon nitride ceramics by dynamic ripening", Nature 417, 266 (2002)).

Figure 3:
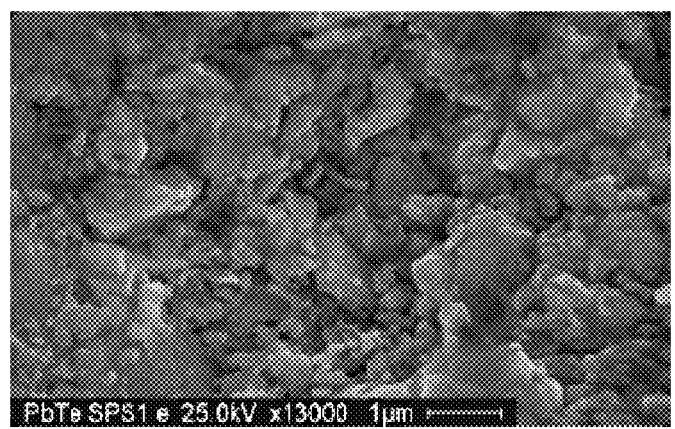
FIG. 3 is a scanning electron micrograph of a dense PbTe nanocomposite formed with 100-150 nm PbTe nanocrystals. The fractured surface indicates 100 nm to 1.5 μm grains distributed within a bulk material.

Varying the parameters, pressure and current (DC and pulsed), adjusts the grain size in the 10 to 100 nm range, allowing for tuning of grain-size and transport properties. The nanostructure is preserved following the SPS procedure, with grains ranging from 100 nm to over 1 micron, as seen in the representative SEM image of a PbTe fracture surface in FIG. 3. This image also indicated SPS densification allows for nanocomposite formation with minimal conglomeration of the nanograins.

Nanocomposite Formation

Different chalcogenide constituents were doped using the techniques described above. A major complication in consolidating nanoparticles within a bulk matrix is the formation of an organic or oxide molecular layer on the surface which is very hard to remove completely. Such a layer may lead to high $\rho$ due to inter-particle scattering. In addition, for thermoelectric applications, doping towards optimized carrier concentrations is essential. As shown below, the overall $S^2\sigma$ of PbTe nanocomposites is enhanced ($\sigma$ is not drastically reduced). Ag-doped PbTe nanocrystals were prepared as described above with the addition of $Ag(CH_3COO)_2$ to the aqueous solution. X-ray diffraction indicated phase-purity while Hall measurements indicated an increase in carrier concentration as compared to the nominally undoped PbTe nanocomposites, seen in Table I.

Core-shell composites permit the formation of an ultra-thin layer of a desired material (either metallic or, more interestingly, another chalcogenide) around chalcogenide nanocrystals, forming a cladding that can act as a "quantum well" structure. The thickness and type of material of the cladding will determine the strength of the scattering of charge carriers, as well as the tunneling probability of the higher energy carriers, thus allowing for the "tunability" of electrical properties. While carrier mobility decreases, the increase in S for an optimized configuration compensates for the mobility decrease and leads to an overall enhancement in $S^2\sigma$, while also reducing $\kappa_L$, increasing the overall TE properties. Core shell composites also prevent grain growth that may lead to the reduction in the nano-features during extended high temperature TE device operation.

The growth of epitaxial shells over the core nanocrystals has been demonstrated using a modified two-injection synthesis process (M. Brumer, et al., "PbSe/PbS and PbSe/PbSe$_x$S$_{1-x}$ Core/Shell Nanocrystals", Advanced Functional Materials 15, 1111 (2005)). This method has demonstrated success in many "Core/Shell" systems, including Si/SiO$_2$, CdS/Cd(OH)$_2$, CdSe/ZnSe, CdSe/ZnS, CdS/HsS/CsS, CdS/CdS, PbSe/PbS and PbSe/PbSe$_x$S$_{1-x}$ (M. Brumer, et al., "PbSe/PbS and PbSe/PbSe$_x$S$_{1-x}$ Core/Shell Nanocrystals", Advanced Functional Materials 15, 1111 (2005); X. Peng, et al., "Epitaxial Growth of Highly Luminescent CdSe/CdS Core/Shell Nanocrystals with Photostability and Electronic Accessibility", J. Amer. Chem. Soc., 119, 7019 (1997)). Extending this technique to nanocomposites such as PbSe—PbTe and their alloys enables relative bandgap tailoring between the two materials and possible tuning of the electronic structure by varying shell thickness.

PbTe nanocomposites were prepared by densifying 100 nm PbTe nanocrystals synthesized in high-yield employing a solution-phase reaction of two monometallic aqueous precursor solutions (J. Martin, et al., "PbTe nanocomposites synthesized from PbTe nanocrystals", Appl. Phys. Lett. 90, 222112 (2007); W. Zhang, et al., "Synthesis of nanocrystalline lead chalcogenides PbE (E=S, Se, or Te) from alkaline aqueous solutions" Materials Research Bulletin 35:12, 2009 (2000)). Lead telluride nanocrystals were synthesized employing an aqueous solution-phase reaction by mixing a Te—KOH aqueous solution and lead acetate trihydrate (Pb(CH$_3$COO)$_2$·3H$_2$O) solution at low temperature and standard atmosphere. The carrier concentrations were modified by directly doping the PbTe nanocrystals with Ag (Ag$_2$Te) prior to the densification procedure (specimens III and IV). Ag-doped PbTe nanocrystals were prepared by dissolving 0.33 mg a Ag compound in 6.68 gm of (Pb(CH$_3$COO)$_2$·3H$_2$O) solution to achieve the desired carrier concentration. This procedure reproducibly synthesizes 100-150 nm spherical PbTe nanocrystals, confirmed by TEM, with a high yield. The amounts disclosed are exemplary and should not be construed as limiting the invention. The amounts disclosed may be varied by one in the art based on the desired quantity of end product, such as the amount of Ag doping in the PbTe nanocrystals disclosed in the present example.

These nanocrystals were subjected to Spark Plasma Sintering to consolidate these nanoscale grains within a dense PbTe matrix at 95% bulk theoretical density, resulting in a dimensional nanocomposite structure, as observed in scanning electron microscope images of both fracture and polished surfaces. Densifying solely the nanocrystals results in the dispersion of non-conglomerated nanostructure within a bulk matrix, (J. Martin, et al., "PbTe nanocomposites synthesized from PbTe nanocrystals", Appl. Phys. Lett. 90, 222112 (2007)) with grains ranging from 100 nm to over 1 micron. Table I lists room temperature physical properties, described below. X-ray diffraction following SPS indicated ~5 vol. % PbTeO$_3$ impurity for specimens I and II, and ~3 vol. % TeO$_2$ impurity for specimens III and IV.

The nanocomposites were cut into 2×2×5 mm$^3$ parallelepipeds for transport property measurements. Four-probe resistivity and steady-state gradient sweep Seebeck coefficient, $\rho$ and S respectively, were measured from 12 to 300 K in a custom radiation-shielded vacuum probe with maximum uncertainties of 4%, and 6%, respectively, at 300 K (J. Martin, et al., "Thermoelectric properties of silicon-germanium type I clathrates" J. Appl. Phys. 102, 103719 (2007)). Temperature dependent four-probe Hall measurements were conducted from 5 to 300 K at both positive and negative magnetic fields of up to 5 T to eliminate voltage probe misalignment effects and room temperature measurements taken to eliminate thermal instabilities with a 10% uncertainty.

TABLE I

Room temperature thermal conductivity κ, resistivity ρ, Seebeck coefficient S, carrier concentration p, energy barrier height $E_B$, trapping state density $N_t$, energy barrier width W, and effective crystallite size L, at 300K, as described below, for undoped PbTe (specimens I and II) and Ag-doped PbTe (specimens III and IV).

| Specimen | κ (W-m$^{-1}$K$^{-1}$) | ρ (mΩ-cm) | S (μV/K) | p (cm$^{-3}$) | $E_B$ (meV) | $N_t$ (cm$^{-2}$) | W (nm) | L (nm) |
|---|---|---|---|---|---|---|---|---|
| I | 2.2 | 24.9 | 328 | 9.5 ×10$^{17}$ | 60 | 1.0 ×10$^{13}$ | 54 | 316 |
| II | 2.5 | 12.6 | 324 | 1.5 ×10$^{18}$ | 60 | 1.3 ×10$^{13}$ | 43 | 396 |
| III | 2.8 | 3.9 | 198 | 5.1 ×10$^{18}$ | 60 | 2.4 ×10$^{13}$ | 23 | 376 |
| IV | 2.7 | 2.9 | 207 | 6.2 ×10$^{18}$ | 60 | 2.6 ×10$^{13}$ | 21 | 416 |

Figure 4:
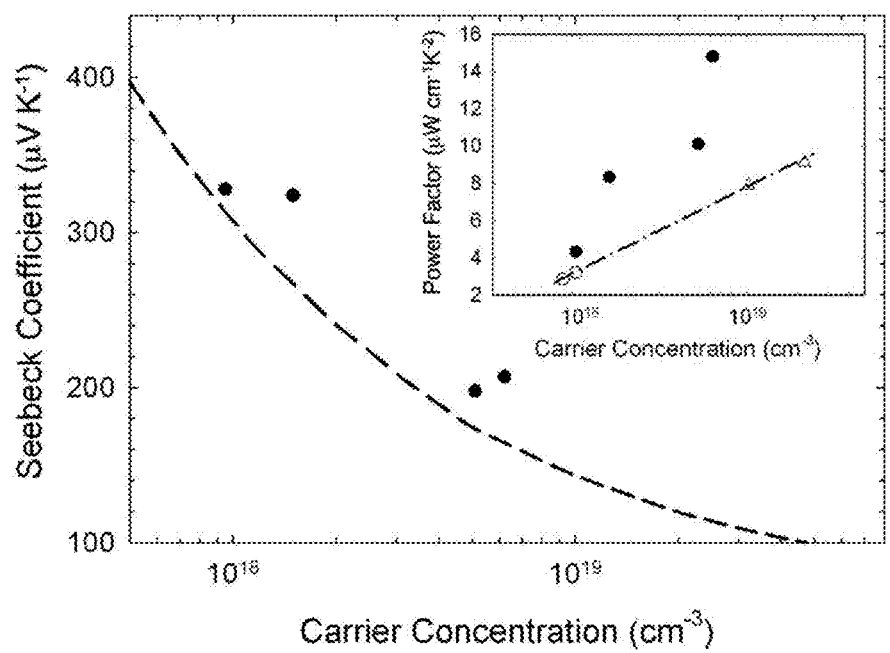
FIG. 4 is a graph of the room-temperature Seebeck coefficient as a function of carrier concentration for the four PbTe nanocomposites (data points) and the calculated bulk relationship (dashed line) from A. J. Crocker and L. Rogers, Br. J. Appl. Phys. 18 563 (1967). The inset shows room temperature power factor as a function of carrier concentration for the four PbTe nanocomposites in comparison to bulk undoped PbTe (open circles) and Na-doped PbTe (open triangles). The straight line is a guide for the eye only.

FIG. 4 contains a comparison of S of four PbTe nanocomposites to that of bulk PbTe specimens, including bulk polycrystalline PbTe, (A. J. Crocker and L. M. Rogers, Brit. "Interpretation of the Hall coefficient, electrical resistivity and Seebeck coefficient of p-type lead telluride", J. Appl. Phys. 18, 563 (1967)) single crystal PbTe, and theoretically calculated values (J. Martin, et al., "PbTe nanocomposites synthesized from PbTe nanocrystals", Appl. Phys. Lett. 90, 222112 (2007)). As seen in FIG. 4, S values for the nanocomposites are larger than that of the bulk, even at similar carrier concentrations. S for one of the nanocomposites is larger by 23% as compared to that of the bulk polycrystalline specimen with the same carrier concentration, p. Similar S values also exhibit higher p in the nanocomposite by 47% as compared to that of the bulk, but do not result in significantly higher resistivity values in the nanocomposites as compared to the bulk polycrystalline specimens, as seen in Table I. Testing of the nanocomposites has shown enhanced room temperature $S^2\sigma$ for the nanocomposites of as much as 50% over that of polycrystalline bulk, and demonstrate that dispersed nanocrystals within dense bulk polycrystalline specimens can be synthesized from nanocrystals formed by solution phase and sonochemical synthesis with enhanced S without dramatically reducing σ.

For all specimens, a linear and positive magnetic field dependence of the Hall resistance confirms dominant p-type conduction. The carrier concentrations increase upon Ag-doping by more than a factor of 5, as listed in Table I. Correspondingly, the ρ values, as shown in Table I, exhibit a significant reduction in magnitude compared to the undoped specimens. All specimens exhibit relatively large room-temperature S values of approximately 325 μV/K for the two undoped specimens and 200 μV/K for the two Ag-doped specimens.

Figure 5:
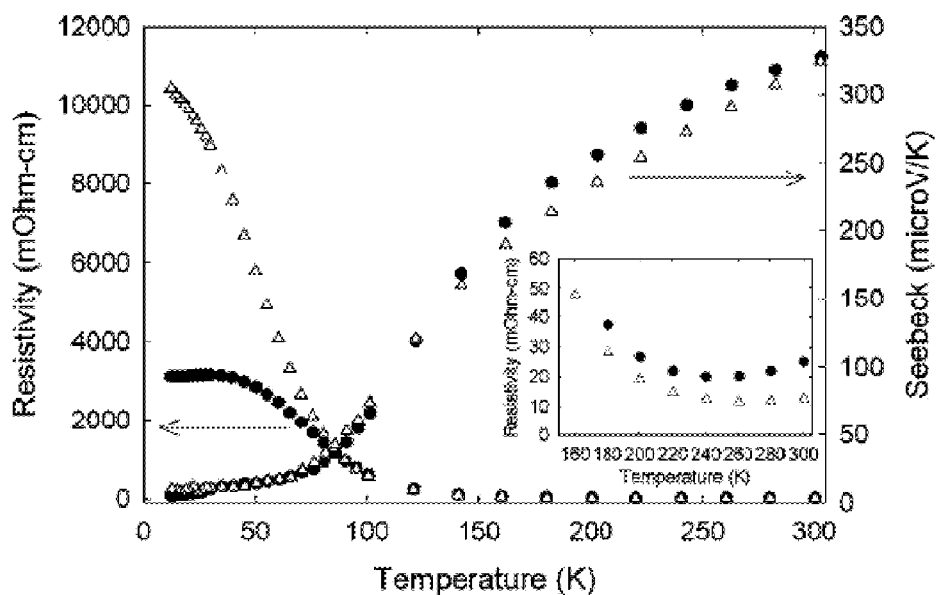
FIG. 5 is a graph depicting resistivity and Seebeck coefficient of PbTe1 (circles) and PbTe2 (triangles) specimens from room temperature to 12 K.

The low temperature ρ values show activated temperature dependence (dρ/dT<0) in all specimens, and a nonlinear increase with decreasing temperature but with a sharp peak in ρ near 70 K for the Ag-doped specimens, seen in FIG. 5. Below 70 K the ρ values rapidly decrease with decreasing temperature. However, temperature dependent carrier concentration for all specimens indicates only a weak dependence with temperature. Lead chalcogenides exhibit large dielectric permittivity (∈) and small effective mass (m*) that merge impurity levels with the allowed energy band, resulting in low temperature impurity ionization, with energy $\propto m^* \in^{-2}$ (Yu. I. Ravich, B. A. Efimova, and I. A. Smirnov, Semiconducting Lead Chalcogenides, Plenum, N.Y. (1970); C. Kittel, Introduction to Solid State Physics, Second Edition, John Wiley & Sons, Inc., New York, p. 356 (1956)). Consequently, the carrier concentration remains approximately constant where there is no degeneracy down to low temperature.

Figure 6:
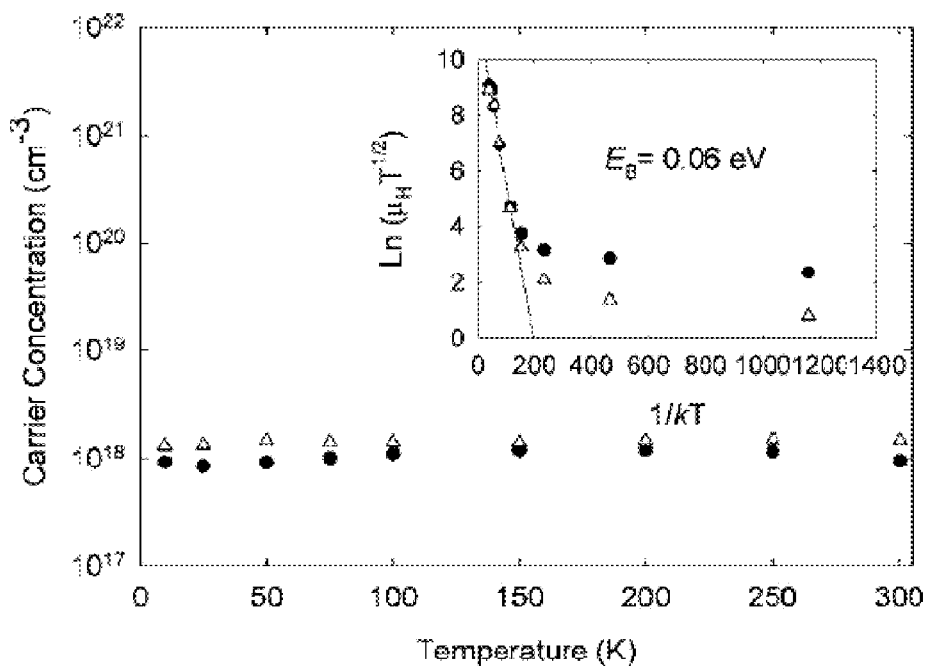
FIG. 6 is a graph depicting temperature dependent carrier concentration and mobility (insert) for PbTe1 (circles) and PbTe2 (triangles). Plotting the logarithm of $\mu_B = \mu_o(1/T)^{1/2} \exp(-E_b/kT)$ yields an energy barrier of 0.06 eV for both specimens.
Figure 7:
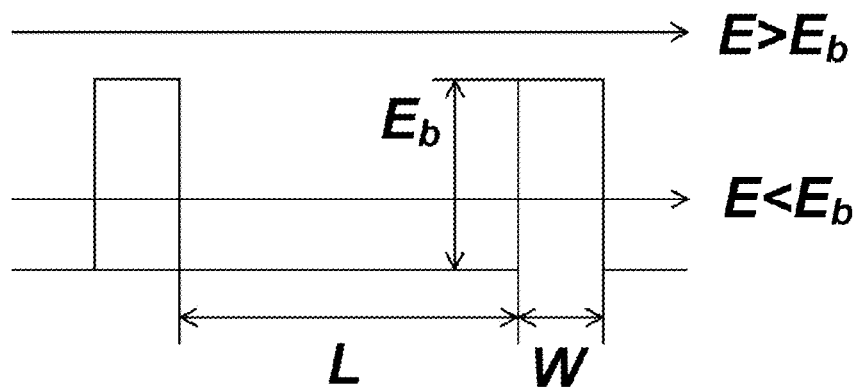
FIG. 7 is a schematic drawing of a grain region limited by rectangular potential barriers. The height of the barrier is $E_b$, the width w and the grain size L. The carrier energy is E.

FIG. 6 shows the temperature dependence of the mobility, μ, for the two Ag-doped specimens in comparison to the two undoped nancomposites. While the room temperature mobilities are consistent with those reported in the literature, the temperature dependence differs significantly from single crystal and polycrystalline lead chalcogenides since the nanocomposite mobilities decrease with decreasing temperature, opposite to that of bulk materials reported in the literature (Yu. I. Ravich, B. A. Efimova, and I. A. Smirnov, Semiconducting Lead Chalcogenides, Plenum, N.Y. (1970); W. Scanlon, in Solid State Physics 9, Academic Press, NY (1959); Z. H. Dughaish, Physica B, 322, 205 (2002); E. H. Putley, Proc. Phys. Soc. B 65, 388 (1952)). In addition, the low temperature μ values for the Ag-doped specimens also show an order of magnitude increase as compared to the undoped specimens and exhibit a dip in μ (an approximately two-fold decrease) near 80 K, as compared to those values at the lowest temperature.

The nanocomposite model was tested by comparing low temperature transport measurements for Ag-doped PbTe nanocomposites. These results demonstrate how effectively the model describes experimental data for PbTe nanocomposite material.

The scattering mechanisms that dominate the transport in bulk lead chalcogenides do not fully describe the unique temperature dependence of μ in these nanocomposites, implying the presence of an additional scattering mechanism. In non-degenerate semiconductors the carriers are scattered by long-wavelength acoustic phonons, $\mu \propto m^{*-5/2} T^{-3/2}$ (Yu. I. Ravich, B. A. Efimova, and I. A. Smirnov, Semiconducting Lead Chalcogenides, Plenum, N.Y. (1970)). Since the factor $m^{*-5/2}$ is inversely proportional to temperature in lead chalcogenides (based on experimental temperature dependence of m*), the mobility therefore varies with $T^{-5/2}$, as experimentally observed in single crystal and polycrystalline lead chalcogenides, with a weaker dependence in degenerate specimens (Yu. I. Ravich, B. A. Efimova, and I. A. Smirnov, Semiconducting Lead Chalcogenides, Plenum, N.Y. (1970); W. Scanlon, in Solid State Physics 9, Academic Press, NY (1959).). This dependence is opposite of that observed in the PbTe nanocomposites, suggesting phonon scattering is present in combination with an additional mechanism. Furthermore, the experimental data indicates μ is not proportional to $T^{3/2}$ in these nanocomposites and suggests scattering by ionized impurities is not a dominant mechanism. The high ∈ in PbTe implies suppression of long-range Coulomb potentials, limiting scattering to near the internal point of an impurity due to the large Bohr radius ($\propto m^{*-1}\in$, on the order of the lattice constant) (E. H. Putley, Proc. Phys. Soc. B 65, 736 (1952); N. A. Poklonski, S. A. Vyrko, V. I. Yatskevich, and A. A. Kocherzhenko, J. Appl. Phys. 93, 9749 (2003)) and consequently, a small screening length. Therefore, it is unlikely that ionized impurity scattering is effectively present in these nanocomposites, particularly at room temperature where the interaction time (the time required for the carrier to pass the region of one impurity ion) (N. A. Poklonski, S. A. Vyrko, V. I. Yatskevich, and A. A. Kocherzhenko, J. Appl. Phys. 93, 9749 (2003)) is significantly shorter.

The nanocomposite carrier conduction can be effectively described as dominated by grain-boundary potential barrier scattering, in combination with phonon scattering. Similar models have successfully described the electrical properties of silicon, CdTe, and nanostructured metal oxide films (C. H. Seager, "Grain boundary recombination: Theory and experiment in silicon", J. Appl. Phys. 52, 3960 (1981); J. Y. W. Seto, J. Appl. Phys. 46, 5247 (1975); O. Vigil-Galan, et al., "Influence of the growth conditions and postdeposition treatments upon the grain boundary barrier height of CdTe thin films deposited by close space vapor transport", J. Appl. Phys. 90, 3427 (2001); G. Kiriakidis, et al., "High Performance Gas Sensing Materials Based on Nanostructed Metal Oxide Films", Rev. Adv. Mater. Sci. 10, 215 (2005)). Studies indicated oxygen adsorption in the PbTe nanocomposites (J. Martin, et al., "PbTe nanocomposites synthesized from PbTe nanocrystals", Appl. Phys. Lett. 90, 222112 (2007)). This surface reactivity is difficult to prevent, considering the aqueous nature of the synthesis technique (W. Zhang, et al., "Synthesis of nanocrystalline lead chalcogenides PbE (E=S, Se, or Te) from alkaline aqueous solutions" Materials Research Bulletin 35:12, 2009 (2000)). The surface oxidation of PbTe is a sequential process, proceeding first through the formation of weak peroxide-like structures (up to 70% coverage) then by the chemisorption of oxygen (T. S. Zyubina, V. S. Neudachina, L. V. Yashina, V. I. Shtanov, Surface Science 574, 52 (2005)). Density Functional Theory (DFT) calculations of the surface reactivity of PbTe (T. S. Zyubina, V. S. Neudachina, L. V. Yashina, V. I. Shtanov, "XPS and ab initio study of the interaction of PbTe with molecular oxygen", Surface Science 574, 52 (2005)) indicate these oxygen complexes form chemical bonds by transferring charge from the tellurium atoms (T. S. Zyubina, V. S. Neudachina, L. V. Yashina, V. I. Shtanov, "XPS and ab initio study of the interaction of PbTe with molecular oxygen", Surface Science 574, 52 (2005)). These chemical shifts were experimentally confirmed through X-ray Photoemission Spectroscopy (XPS). The chemisorption of oxygen essentially forms carrier trapping acceptor states by removing electrons from the grain surface, reducing itinerant carrier density. For nanocrystalline materials, this chemisorption results in increased trapping of carriers at grain boundaries, forming energy barriers that impede the conduction of carriers between grains. Assuming a uniformly distributed concentration of ionized carrier traps, $N_t/cm^2$, a grain boundary thickness less than the crystallite size L, whose morphology and size distribution are identical, and ρ within the grains less than through the boundary, the effective mobility is given by (J. Y. W. Seto, "The electrical properties of polycrystalline silicon films", J. Appl. Phys. 46, 5247 (1975)):

$$\mu_{eff} = Lq\left(\frac{1}{2\pi m * kT}\right)^{1/2} \exp\left(-\frac{E_B}{kT}\right), \quad (13)$$

where q is the carrier charge, m* the effective mass, k the Boltzmann constant, T the temperature, and $E_B$ is the height of the energy barrier in the depletion region. A plot of the logarithm of μ vs. 1/kT for the PbTe nanocomposites, seen in FIG. 6, indicates activated behavior from conduction through the boundary potential barrier between grains. Fitting the higher temperature data yields an energy barrier $E_B$=60 meV for all specimens. This suggests the energy barriers form through a similar oxygen chemisorption mechanism in both the undoped and Ag-doped specimens. Conduction through ballistic transport occurs when the average energy of the charge carriers is sufficient to overcome this energy barrier. As the temperature increases, the average energy of the charge carriers increases and therefore the electrical conductivity increases $\propto T^{-1/2}\exp(-E_B/kT)$. This mechanism dominates at higher temperature and for higher carrier densities, where the concentration of carriers with larger average energy is larger. However, an additional conduction mechanism dominates at lower temperature. When the grain boundary energy barrier is sufficiently narrow and high, the charge carriers quantum mechanically tunnel through the barrier (J. Y. W. Seto, "The electrical properties of polycrystalline silicon films", J. Appl. Phys. 46, 5247 (1975)). In equilibrium, the dependence of barrier height $E_B$ on the density of trapping states $N_t$ and the carrier concentration ρ is given by: $E_B = q^2 N_t^2/8\in\in_o p$, and the barrier width (space charge region) by: $W=(2\in\in_o E_B/q^2 p)^{1/2}$, (C. H. Seager, "Grain boundary recombination: Theory and experiment in silicon", J. Appl. Phys. 52, 3960 (1981); O. Vigil-Galan, et al., "Influence of the growth conditions and postdeposition treatments upon the grain boundary barrier height of CdTe thin films deposited by close space vapor transport", J. Appl. Phys. 90, 3427 (2001)) where q is the carrier charge, ∈=414 for PbTe at 300 K (R. Clasen, et al., *Landolt-Bornstein: Numerical Data and Functional Relationships in Science and Technology*, Volume 17 Semiconductors, Subvolume f, Ed. by K. H. Hellwege and O. Madelung, (Springer, New York, pg. 170, 1983)), and $\in_o$ is the vacuum permittivity. Table I lists these calculated values for the two undoped specimens in comparison to the two Ag-doped specimens. As the carrier concentration increases with doping, the barrier height remains constant, but promotes an increase in trapping state density. Furthermore, as the carrier concentration increases, the barrier width decreases by a factor $\propto p^{-1/2}$. This suggests an increase in tunneling conduction (transmission probability) with doping.

The one-dimensional, time-independent WKB transmission probability τ for the potential barrier is given by (V. V. Mitin, "Contribution of light holes to thermionic field emission in Si and Ge", Phys. Rev. B 31, 2584 (1985)):

$$\tau(E) = \exp(-2\int_{x_1}^{x_2}\{2m^*[qV(x)-E]\}^{1/2}dx/\hbar), \quad (14)$$

where $x_1$ and $x_2$ are the classical carrier turning points with energy E, m* is the effective mass, and qV(x) is the interfacial barrier energy. Therefore, the tunneling probability is a maximum for charge carriers with smaller m*. The electrical transport in p-type PbTe is dominated by two bands: a lower mobility heavy hole (HH) valence band below the light hole (LH) valence band at low temperature, where 10 $m_{LH}^* \sim m_{HH}^*$ (Yu. I. Ravich, B. A. Efimova, and I. A. Smirnov, *Semiconducting Lead Chalcogenides*, Plenum, N.Y. (1970); L. M. Rogers, "Drift mobility of light-mass holes in PbTe heavily doped with Na", Brit. J. Appl. Phys. 1, 1067 (1968)).

We assume similar m* and band structure for the nanocomposites. At low temperature and higher hole densities, the electrical properties are dominated nearly exclusively by the LH carriers. As the temperature increases, the HH band rises, resulting in a decreasing τ and an increase in carrier scattering for the higher carrier density specimens. At higher temperature, when the average energy of the charge carriers is sufficient to overcome the grain boundary energy barrier, conduction is dominated through thermionic emission, $T^{1/2}\exp(-E_B/kT)$, and µ increases with temperature. Grain-boundary potential barrier scattering of the carriers, in combination with phonon scattering, gives rise to the unique temperature dependence of the electrical conductivity and the mobility in these nanocomposites.

The effective crystallite size was estimated using equation 1, the energy barriers obtained from fitting the temperature dependence of µ, the µ values calculated from the room temperature carrier concentration, and the HH $m^*=1.5\,m_o$ (Yu. I. Ravich, B. A. Efimova, and I. A. Smirnov, *Semiconducting Lead Chalcogenides*, Plenum, N.Y. (1970) and references therein). These estimates indicate effective crystallite sizes between 300 and 400 nm, listed in Table I, and are consistent with the dimensional nanocomposite structure observed in our SEM analyses. This suggests the grain boundary energy barrier scattering is dominated through these nanoscale features. Of note, inclusion of LH carriers in the calculation only slightly lowers the effective crystallite size.

Furthermore, conduction through the boundary potential barrier between grains essentially filters lower energy charge carriers, increasing the average carrier energy and consequently, |S|. FIG. 4 shows the room temperature S for the PbTe nanocomposites in comparison to theoretically calculated bulk values (Yu. I. Ravich, B. A. Efimova, and I. A. Smirnov, *Semiconducting Lead Chalcogenides*, Plenum, N.Y. (1970) and references therein; A. J. Crocker and L. M. Rogers, Brit. J. Appl. Phys. 18, 563 (1967)), indicating an enhancement in S as compared to bulk PbTe at the same carrier concentration. In addition, we compare the room temperature $S^2/\rho$ for the nanocomposites to two of our undoped and two Na-doped bulk PbTe specimens, indicating an enhancement in $S^2/\rho$ over that of bulk PbTe by up to a factor of two (inset in FIG. 4). The larger $S^2/\rho$ in the nanocomposites as compared to bulk polycrystalline materials, in addition to similar thermal conductivities (Table I and Yu. I. Ravich, et al., *Semiconducting Lead Chalcogenides*, Plenum, N.Y. (1970)), results in enhanced room temperature ZT of up to a factor of two as compared to bulk PbTe. Therefore interfacial energy barrier carrier filtering is an effective method of thermoelectric performance enhancement in these bulk nanocomposites.

PbTe nanocomposites were prepared by densifying 100 nm PbTe nanocrystals synthesized in high yield employing a solution-phase technique. SPS successfully consolidated these nanoscale grains within a dense PbTe matrix. The carrier concentrations were modified by directly doping the PbTe nanocrystals with Ag prior to densification. The unique temperature dependence of ρ and µ suggests an additional scattering mechanism in combination with phonon-carrier scattering dominant in single crystal and polycrystalline lead chalcogenides. For these nanocrystalline materials, the chemisorption of oxygen likely results in increased trapping of carriers at grain boundaries, forming energy barriers that impede the conduction of carriers between grains. This conduction is effectively described as dominated by grain-boundary potential barrier scattering, in combination with phonon scattering. Furthermore, these nanocomposites demonstrate an enhanced TE performance as compared to bulk PbTe, thus interfacial energy barrier carrier scattering is an effective method of thermoelectric performance enhancement in bulk nanocomposites.

In the preceding specification, all documents, acts, or information disclosed does not constitute an admission that the document, act, or information of any combination thereof was publicly available, known to the public, part of the general knowledge in the art, or was known to be relevant to solve any problem at the time of priority.

The disclosures of all publications cited above are expressly incorporated herein by reference, each in its entirety, to the same extent as if each were incorporated by reference individually.

While there has been described and illustrated specific embodiments of a thermoelectric device, it will be apparent to those skilled in the art that variations and modifications are possible without deviating from the broad spirit and principle of the present invention. It is also to be understood that the following claims are intended to cover all of the generic and specific features of the invention herein described, and all statements of the scope of the invention which, as a matter of language, might be said to fall therebetween.

What is claimed is:

1. A thermoelectric element, comprising;
    a nanocomposite formed from a core-shell nanoparticle, where the shell has been densified around the core;
        wherein the core-shell nanoparticle further comprises:
            a doped core, where the core is a first chalcogenide and is doped with a metal or second chalcogenide dopant;
            wherein the shell is a metal or semiconducting compound comprises at least one element selected from Groups IV-VI;
    wherein grains of the densified metal or semiconducting compound possess an orientational direction; and
    wherein the dopant is integrated into the core such that energy barriers form affecting carrier mobility.

2. The thermoelectric element of claim 1, wherein the dopant is selected from the group consisting of Ag, Au, Bi, Br, Cl, Cu, I, Mn, Na, Pb, and Zn.

3. The thermoelectric element of claim 1, wherein the shell is a Group IV-VI semiconductor material, wherein the Group IV-VI semiconductor is PbSe, $SbTe_2$, $AgSbTe_2$, $PbSn_xSe_{1-x}$, an alloy of PbTe, an alloy of PbSe, or other third chalcogenide.

4. The thermoelectric element of claim 3, wherein the third chalcogenide comprises highly crystal grains.

5. The thermoelectric element of claim 1, wherein the shell is densified by spark plasma sintering, hot pressing or extrusion.

6. The thermoelectric element of claim 1, wherein the grains of the densified metal or semiconducting compound are between 1 and 100 nm.

7. The thermoelectric element of claim 3, wherein the third chalcogenide is selected from the group consisting of $Bi_2Te_3$, $Sb_2Te_3$, PbSeTe, PbTe, CdS CdSe, ZnSe, ZnS, CsS, PbS, and $PbSe_xS_{1-x}$.

8. The thermoelectric element of claim 1, wherein the thermoelectric element is selected from the group consisting of heat sensors, heat pumps, and thermoelectric generators.

9. The thermoelectric element of claim 7, wherein the thermoelectric element is a thermoelectric generator adapted for use on an automobile.

10. The thermoelectric element of claim 3, wherein the Group IV-VI semiconductor is PbTe or PbSe.

11. The thermoelectric element of claim 10, wherein the Group IV-VI semiconductor is PbTe.

12. The thermoelectric element of claim 1, wherein the core of the core-shell nanoparticle is cuboid, spherical, or nanorod.

13. The thermoelectric element of claim 12, wherein the core of the core-shell nanoparticle is dimensioned from 10 nm to several hundred nanometers in size.

14. The thermoelectric element of claim 1, wherein the core-shell nanoparticles are epitaxially grown.

15. The thermoelectric element of claim 1 wherein the affected carrier mobility produces an increase in the Seebeck coefficient.

16. A method of generating a thermoelectric element comprising the steps of:
   forming a nanocomposite from a core-shell nanoparticle, where the shell has been densified around the core;
   wherein the core-shell nanoparticle further comprises:
      a doped core, where the core is a first chalcogenide and is doped with a metal or second chalcogenide dopant, wherein the doped core is formed from the steps:
         forming a plurality of nanocrystal cores, further comprising the steps of:
            providing a first chalcogenide material and at least one semiconductor selected from Groups IV-VI, wherein the first chalcogenide material and at least one semiconductor selected from Groups IV-VI are precursor solutions of the first chalcogenide core material;
            providing a dopant precursor, wherein the dopant is a metal or second chalcogenide dopant;
            mixing the dopant precursor with the precursor first chalcogenide material, at least one semiconductor selected from Groups IV-VI, and dopant precursor;
            forming the plurality of nanocrystal cores;
      wherein the shell is a metal or semiconducting compound comprises at least one element selected from Groups IV-VI,
   densifying the shell of the core-shell nanoparticles to form a nanocomposite, VI disposed around the nanocrystal core, wherein grains of the densified metal or semiconducting compound possess an orientational direction; and
   wherein the dopant is integrated into the core such that energy barriers form affecting carrier mobility.

17. The method of generating a thermoelectric element of claim 16 wherein the energy barriers produce an increase in the Seebeck coefficient.

18. The method of claim 16, wherein the shell consists of $Bi_2Te_3$, $Sb_2Te_3$, PbSeTe, PbTe, CdS CdSe, ZnSe, ZnS, CsS, PbS, or $PbSe_xS_{1-x}$.

19. The method of claim 16, wherein the plurality of nanocrystal cores are formed from the steps further comprising mixing telluride potassium hydroxide with lead acetate at standard atmosphere.

20. The method of claim 19, wherein the dopant precursor is dissolved in the lead acetate.

21. The method of claim 16, wherein the dopant is silver or sodium.

22. The method of claim 21, wherein the dopant precursor is silver acetate.

23. The method of claim 16, wherein the nanocrystal cores are formed by ultrasonic homogenizer.

24. The method of claim 16, wherein the shell of the core-shell nanoparticles is densified by spark plasma sintering, hot pressing or extrusion.

* * * * *